United States Patent
Ahmad et al.

(10) Patent No.: US 11,766,833 B2
(45) Date of Patent: Sep. 26, 2023

(54) NEAR-FIELD MICROWAVE HEATING SYSTEM AND METHOD

(71) Applicants: Iftikhar Ahmad, Raleigh, NC (US); Keith R. Hicks, Garner, NC (US); Andrew Cardin, Cary, NC (US); Clayton R. DeCamillis, Raleigh, NC (US); Richard C. Hazelhurst, Holly Springs, NC (US); Angelo Luciano, Kenilworth (GB); Andrew Bools, Leicester (GB); Robert J. Schauer, Durham, NC (US)

(72) Inventors: Iftikhar Ahmad, Raleigh, NC (US); Keith R. Hicks, Garner, NC (US); Andrew Cardin, Cary, NC (US); Clayton R. DeCamillis, Raleigh, NC (US); Richard C. Hazelhurst, Holly Springs, NC (US); Angelo Luciano, Kenilworth (GB); Andrew Bools, Leicester (GB); Robert J. Schauer, Durham, NC (US)

(73) Assignee: Expert Tooling and Automation, Ltd., Coventry (GB)

( * ) Notice: Subject to any disclaimer, the term of this patent is extended or adjusted under 35 U.S.C. 154(b) by 557 days.

(21) Appl. No.: 16/894,862

(22) Filed: Jun. 7, 2020

(65) Prior Publication Data

US 2020/0298503 A1    Sep. 24, 2020

Related U.S. Application Data

(62) Division of application No. 15/731,881, filed on Aug. 18, 2017, now Pat. No. 10,710,313.

(Continued)

(51) Int. Cl.
*H05B 6/64* (2006.01)
*H05B 6/68* (2006.01)
(Continued)

(52) U.S. Cl.
CPC ...... *B29C 65/5014* (2013.01); *B29C 65/1425* (2013.01); *B29C 65/1438* (2013.01);
(Continued)

(58) Field of Classification Search
CPC ............ B29C 65/1425; B29C 65/1438; B29C 65/1483; B29C 65/3408; B29C 65/5014;
(Continued)

(56) References Cited

U.S. PATENT DOCUMENTS 3,532,926 A * 10/1970 Winslow ................. H01J 23/36
315/39
5,202,541 A * 4/1993 Patterson ................. H05B 6/64
219/745
(Continued)

FOREIGN PATENT DOCUMENTS

CN     107007521 A  *  8/2017

OTHER PUBLICATIONS

Translation of CN107007521A, "A Cosmetic Mask Material And Its Production Process", Aug. 4, 2017, by ProQuest. (Year: 2017).*

*Primary Examiner* — Quang T Van
(74) *Attorney, Agent, or Firm* — Robert J. Lauf

(57) ABSTRACT

A microwave heating device includes a variable frequency microwave power supply, a waveguide launcher, and a fixture to contain a material to be heated, with the fixture located directly adjacent to the end of the launcher. All heating occurs in the near-field region, i.e., no cavity modes or standing waves are established within the fixture. This condition may be insured by keeping the thickness of the fixture or workpiece under one wavelength (at all micro- (Continued)

wave frequencies being used). The launcher is preferably a horn configured to spread the microwave power laterally over a selected area while maintaining a single propagating mode. The invention may be used to enhance catalytic reactions for research and other purposes. Alternatively, the invention may be configured to perform spot curing or repair operations involving adhesives and composites.

12 Claims, 15 Drawing Sheets

Related U.S. Application Data

(60) Provisional application No. 62/497,062, filed on Nov. 7, 2016.

(51) Int. Cl.
*B29C 65/50* (2006.01)
*B29C 65/14* (2006.01)
*B29C 65/34* (2006.01)
*H01J 37/32* (2006.01)

(52) U.S. Cl.
CPC ...... *B29C 65/1483* (2013.01); *B29C 65/3408* (2013.01); *H01J 37/32229* (2013.01); *H01J 37/32302* (2013.01); *H05B 6/64* (2013.01)

(58) Field of Classification Search
CPC .. H05B 6/64; H01J 37/32229; H01J 37/32302
USPC ....... 219/678, 686, 690, 709, 716, 761, 757, 219/745; 118/723 ME, 723 MW, 723 R, 118/723; 315/39.3, 39.1, 39, 111.21
See application file for complete search history.

(56) References Cited

U.S. PATENT DOCUMENTS 5,721,286 A * 2/1998 Lauf .................. B29C 35/0805
522/174
2018/0342379 A1* 11/2018 Jurczyk ............. C23C 16/45576

* cited by examiner

NEAR-FIELD MICROWAVE HEATING SYSTEM AND METHOD

CROSS REFERENCE TO RELATED APPLICATION

The present application is a Divisional of U.S. patent application Ser. No. 15/731,881 filed on Aug. 18, 2017, which further claims the benefit of Provisional Pat. Appl. Ser. No. 62/497,062 filed by the present inventors on Nov. 7, 2016, the entire disclosures of which are incorporated herein by reference.

BACKGROUND OF THE INVENTION

Field of the Invention

The invention pertains to apparatus and methods for heating materials with microwaves, and more particularly to heating materials over a large surface area using a near-field microwave applicator.

Description of Related Art

Microwave heating systems generally rely on a waveguide launcher that introduces microwave energy into an enclosed volume, referred to as a cavity. The cavity is typically metal, and the cavity walls enclose and define a volume of space in which microwave fields are established. The cavity may be tuned to support a single resonant mode, in which case it is typically cylindrical. Alternatively, the cavity may be multimode, in which many standing waves are established within the boundary conditions controlled by the size of the cavity, the load, and the wavelength of the microwaves. In either case, care is conventionally taken to place the load or workpiece well away from the near-field region directly adjacent to the waveguide or launcher.

Avoiding the near-field region is done for several reasons:
1. The workpiece is generally larger than the near-field region, so placing the part too close to the launcher will greatly increase the non-uniformity of heating.
2. Modeling the electric field distribution in a large multi-mode cavity is relatively straightforward for the far field case, whereas modeling in the near-field region is very difficult.

In variable-frequency microwave (VFM) heating systems, frequency sweeping is used to maintain a constantly-shifting pattern of standing waves in a multimode cavity, whereby an extremely uniform time-averaged power density is established throughout the working volume of the cavity. In conventional VFM systems, the multimode cavity is significantly larger than one wavelength in all three dimensions to allow for the establishment of many superimposed modes, as explained in detail in U.S. Pat. No. 5,961,871 to Bible et al. However, even in this case, the workpiece cannot be placed in the near-field region where the incoming power density is extremely high because it will prevent the microwave energy from fanning out and establishing the multitude of modes responsible for creating a uniform environment in most of the cavity.

The use of localized or near-field microwave heating has been suggested for a number of applications, such as localized tissue ablation for medical treatment, processing of foods, drying, and other purposes.

US 2015/0313273 to Stromotich et al. teaches a drying apparatus in which material to be dried is conveyed through an elongated cavity. Slotted waveguides extend into the cavity in the direction normal to the conveyor, and microwave energy emerging from the slots in the waveguides is applied to the material in the near field range of the slots.

US 2013/0150844 to Deem et al. discloses a hand-held device for locally treating living tissue by microwave heating. Cooling means are provided so that heating affects underlying tissues without burning the skin of the patient.

US 2011/0301588 to Cronin discloses an elongated microwave radiator with a monopole antenna at the tip, for insertion into a living body.

US 2009/0221999 to Shahidi discloses a handheld device for locally heating tissue, using a probe comprising a plurality of antennas, configured so that, by modifying the frequency or phase of individual antennas relative to one another, near-field interference effects can be used to tailor the pattern of the applied power density.

US 2005/0011885 to Seghatol et al. discloses a hand-held dental tool having a small antenna at its distal end to supply microwave power, taught to be generally less than 10 W at a preferred frequency from about 14 to 24 GHz, to cure dental resin for various restorative procedures.

U.S. Pat. No. 4,420,492 to Taylor discloses a method for shucking oysters by selectively heating the adductor muscle with microwaves. Microwaves are applied either by a small loop antenna or by an inwardly-tapering waveguide that concentrates the energy in a small region so as to heat the adductor muscle without cooking the rest of the contents of the oyster.

U.S. Pat. No. 6,191,402 to Ekemar discloses an RF heating system (50 kHz-299 MHz) in which a load to be heated is placed proximate to a generally planar antenna, disposed within a metal cavity. Ekemar teaches that frequencies below about 300 MHz provide advantages over microwaves, particularly in the depth of penetration into the material being heated. Ekemar further states that, "Favorable heating will be obtained if the cavity space is delimited. The cubic root of the cavity space volume shall not exceed 25% of any wavelength in vacuum conditioned by applied frequency . . . "

The use of microwave energy to generate heat and/or enhance reaction kinetics in various organic reactions and catalysis is well known. A few exemplary disclosures include:

US 2012/0125920 to Novak discloses a method and apparatus for: (1) coupling of microwave energy from a microwave generator or plurality of microwave generators into an integral set of applicators; (2) extraction and separation of organic compounds from a mixture of organic and inorganic compounds; and (3) recovery and conversion of the organic compounds to gaseous and liquid fuels.

US 2014/0051775 to Kyle discloses a method of converting coal into a liquid hydrocarbon fuel utilizes a high pressure, high temperature reactor which operates upon a blend of micronized coal, a catalyst, and steam. Microwave power is directed into the reactor. The catalyst, preferably magnetite, will act as a heating medium for the microwave power and the temperature of the reactor will rise to a level to efficiently convert the coal and steam into hydrogen and carbon monoxide.

US 2015/0337224 to Stiegman discloses a method for the gasification of carbon to yield products including carbon monoxide, hydrogen, and methane. The method comprises irradiating a source of carbon with radiation having a frequency between 300 GHz and 300 MHz and contacting the source of carbon with a reactant such as water, carbon dioxide, hydrogen, and a nitrogen oxide. The choice of reactant dictates the resultant product.

U.S. Pat. No. 6,783,632 to Cha discloses a process for the efficient microwave catalysis production of hydrogen involving a modified steam-reforming reaction using light hydrocarbons or light alcohols as the basic reactant with supplementary oxygen to increase the efficiency.

U.S. Pat. No. 4,279,722 to Kirkbride teaches that petroleum refinery operations involving catalytic reactions are improved by subjecting hydrocarbon reactants in contact with catalytic material to the influence of wave energy in the microwave range.

Objects and Advantages

Objects of the present invention include the following: providing an apparatus for applying microwave power over an extended lateral area while maintaining substantially near-field conditions; providing an apparatus for microwave-heated catalytic reactions; providing an apparatus for uniform microwave heating using a VFM source and a near-field applicator; providing an apparatus for curing adhesives and polymers over a selected area using a near-field applicator; providing an improved method for composite bonding and field repairs; and providing fixturing methods for the safe application of microwave power to a selected surface area, which may be substantially flat or may have some degree of curvature. These and other objects and advantages of the invention will become apparent from consideration of the following specification, read in conjunction with the drawings.

SUMMARY OF THE INVENTION

According to one aspect of the invention, a microwave heating system comprises:

a variable-frequency microwave source;

a waveguide with an input side connected to the source and an output side terminating in a launch structure; and, a fixture positioned to hold a material to be treated directly adjacent to the launch structure so that substantially all of the material to be treated lies in the near field region of said launch structure.

According to another aspect of the invention, a microwave heating system comprises:

a variable-frequency microwave source;

a waveguide with an input side connected to the source and an output side terminating in a launch structure, the launch structure comprising a rectangular horn having a first and a second lateral dimension, with at least one of the first and second lateral dimensions being larger than the wavelength of the microwave energy at the frequency being applied; and, a fixture located to hold a material to be treated directly adjacent to said launch structure so that substantially all of the material to be treated lies within one wavelength of the launch structure at the frequency being applied.

According to another aspect of the invention, a microwave catalysis system comprises:

a variable-frequency microwave source;

a waveguide with an input side connected to said source and an output side terminating in a launch structure;

a microwave transparent, substantially gas-tight fixture to hold a catalyst material, the fixture located directly adjacent to the launch structure so that the catalyst material lies in the near field region of said launch structure; and a gas inlet and outlet in the fixture to allow gas to be passed through the fixture and exposed to both the catalyst and to microwave energy.

According to another aspect of the invention, a polymer curing system comprises:

a variable-frequency microwave source;

a waveguide with an input side connected to the source and an output side terminating in a launch structure, the launch structure comprising a rectangular horn having a first and a second lateral dimension, with at least one of the first and second lateral dimensions being larger than the wavelength of the microwave energy at the frequency being applied;

a compliant, microwave-absorbing structure around the periphery of the launch structure to sealably engage the surface of a workpiece, the workpiece having at least one polymer component to be cured; and, a fixture located to press the workpiece against the launch structure so that substantially all of the polymer component to be cured lies within one wavelength of the launch structure at the frequency being applied, and the compliant structure is compressed against the workpiece to seal against microwave leakage.

According to another aspect of the invention, a microwave heating system comprises:

a variable-frequency microwave source;

a multimode applicator cavity having a waveguide launcher on one wall thereof; and, a fixture including a gas-tight, microwave-transparent tube mounted proximate to the launcher so that the contents of the gas-tight tube may be subjected to microwave energy in the near-field region of the launcher.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore non-limiting embodiments illustrated in the drawing figures, wherein like numerals (if they occur in more than one view) designate the same elements. The features in the drawings are not necessarily drawn to scale.

FIG. 1A shows an elevation view and FIG. 1B shows a plan view of the exemplary system.

FIG. 4A illustrates an overall view of the robot arm and microwave device. FIG. 4B shows how the entire microwave power supply and applicator assembly are attached to the end of the robot arm. FIG. 4C shows the microwave applicator viewed from another direction.

FIG. 7A presents an exploded view of the choke assembly; FIG. 7B shows the assembled choke engaging with a composite seam to be heated.

FIG. 8A presents a perspective view; FIG. 8B presents a cross-sectional view.

FIG. 9A shows two H bends attached to the original launch port. FIG. 9B shows a fixture supporting a quartz tube for holding process gases.

DETAILED DESCRIPTION OF THE INVENTION

Generally, the invention includes a variable frequency microwave power supply, a waveguide launcher, and a fixture to contain a material to be heated, with the fixture located directly adjacent to the end of the launcher. All heating occurs in the near-field region, i.e., no cavity modes or standing waves are established within the fixture. This condition may be insured by keeping the thickness of the fixture under one wavelength (at all microwave frequencies being used).

The launcher is preferably a horn configured to spread the microwave power laterally over a selected area while maintaining a single propagating mode; to this end, the horn may contain ridges compatible with a ridged waveguide and operative over the selected microwave frequency range.

The fixture may comprise a rectangular prism with lateral dimensions corresponding to the dimensions of the launch structure and a thickness less than the microwave wavelength at the operative frequency, and preferably less than half of the microwave wavelength. The fixture may further comprise a gas-tight enclosure having a gas inlet and outlet and further containing a catalyst material.

Alternatively, the fixture may comprise a means for pressing the launch structure securely against an article containing a polymer or adhesive to be cured. The article to be cured may include: polymer composites; carbon fiber composites; lap joints containing adhesive; lap joints in which one component is metallic; and composites having sections undergoing repair.

The fixture may further include a mechanically-compliant microwave choke to engage the workpiece surface and reduce microwave leakage. The fixture may further include a dummy load to absorb microwave power that has passed through the workpiece.

In electrical terms, prior art systems, whether fixed frequency or VFM, involve a cavity in which one or many modes are established, and the workpiece comprises a load, which is limited to some fraction of the total volume of the cavity and kept out of the near-field region so that well established cavity physics applies. The Q factor of the loaded cavity can, at least in principle, be calculated. Stub tuners or other devices may be placed in the waveguide to improve coupling to the cavity and reduce reflected power. Note that Applicants use the term "cavity" in the sense that is well understood within the microwave heating industry. As defined by Wikipedia, "A microwave cavity or radio frequency (RF) cavity is a special type of resonator, consisting of a closed (or largely closed) metal structure that confines electromagnetic fields in the microwave region of the spectrum. The structure is either hollow or filled with dielectric material. The microwaves bounce back and forth between the walls of the cavity. At the cavity's resonant frequencies they reinforce to form standing waves in the cavity."

Figure 9A:
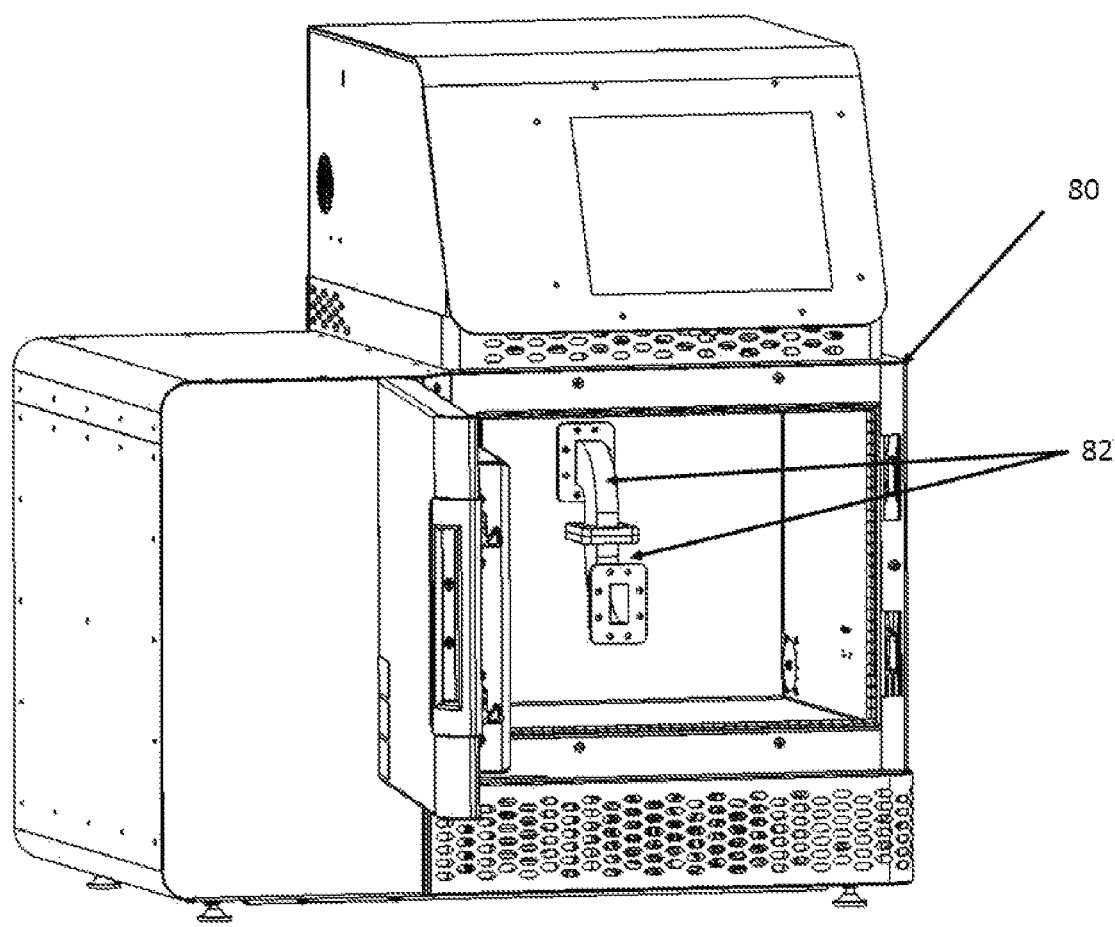
FIGS. 9A-B illustrate a mechanism for creating a near-field applicator within the chamber of a general purpose VFM cavity.
Figure 9B:
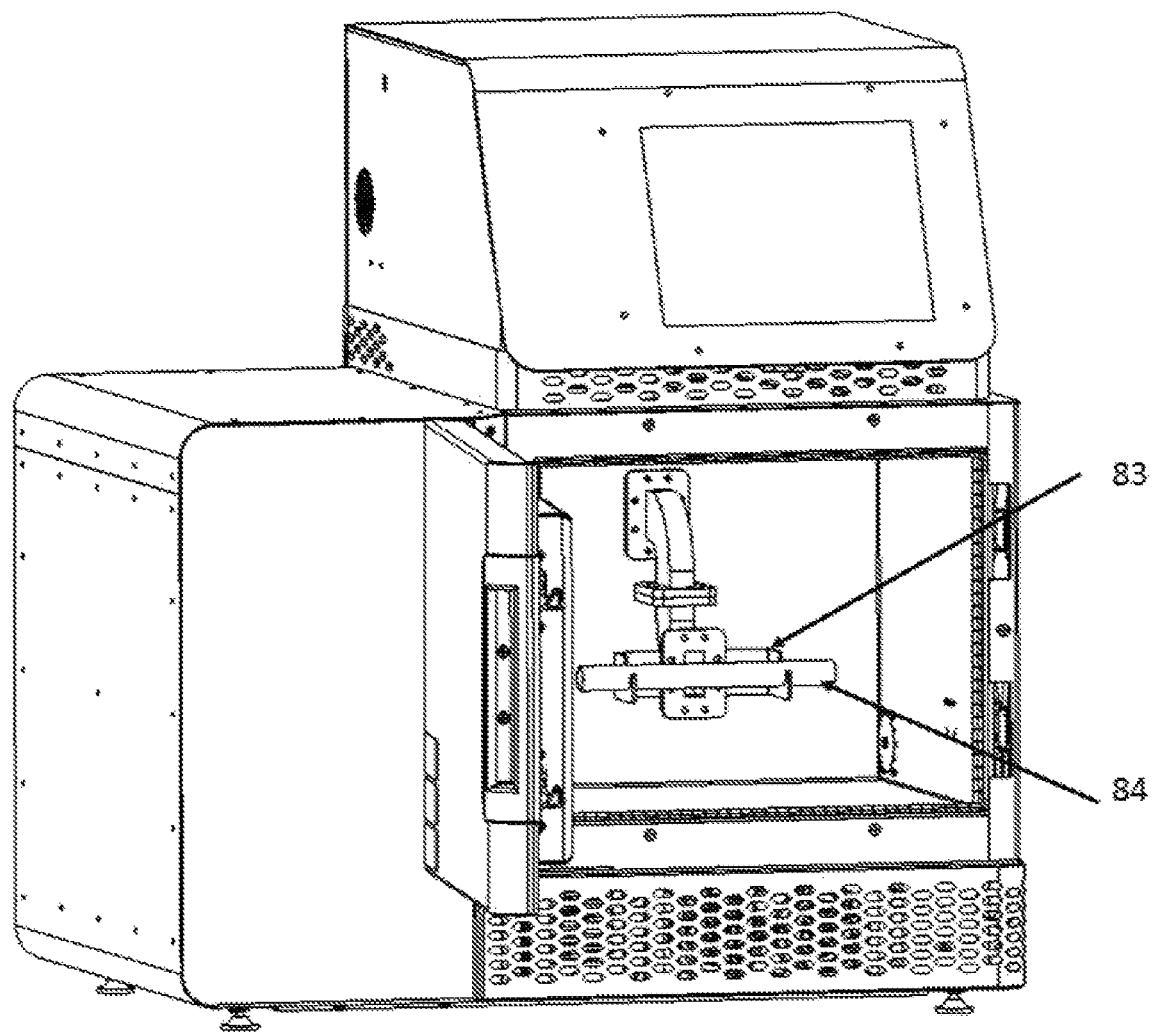

The invention, by contrast, represents a waveguide terminating directly onto the workpiece. There is, effectively, no cavity per se and the entire workpiece lies within the near-field region. Cavity physics does not apply because standing waves cannot be formed when the thickness of the fixture is less than half the wavelength. (Dimensions of the fixture and workpiece may be more than one wavelength in the two other directions, however, as Applicants postulate the tapering horn antenna effectively prevents the establishment of modes or standing waves in those directions.) The electrical circuit effectively created is instead analogous to a waveguide that simply terminates in a dummy load. Note that in one example, illustrated generally in FIGS. 9A-B, a larger cavity surrounds the entire assembly; however, because the inventive fixture effectively obstructs the normal opening of the launcher, it prevents the establishment of normal cavity modes that would form if the fixture and workpiece were not present.

Prior art VFM systems rely on the combination of frequency sweeping and standard cavity physics to establish a generally uniform time-averaged power density in the far-field part of the cavity (generally a few wavelengths away from the launch structure).

The invention, by contrast, contains only the near-field region, does not establish standing waves in a cavity, and uses frequency variation for a completely different function, viz., to more effectively excite gases or gas-solid interactions for catalysis and for other purposes. In an alternative mode, the invention may use frequency variation to speed chemical reactions in polymers and adhesives while avoiding arcing around metal components.

Several of the specific examples that follow describe particular systems and designs intended for use with a C band microwave source (5.85 to 8.20 GHz). It will be understood that these descriptions are exemplary in nature and Applicants do not intend for the invention to be limited to C band or to any particular bandwidth or sweep rate. The skilled artisan may easily modify the invention to operate at other frequencies by following well-known engineering design and modeling principles. In particular, variable frequency microwave sources employing traveling wave tube amplifiers, solid state power amplifiers, tunable magnetrons, etc., may be constructed to operate at a selected microwave frequency range of as much as an octave or more, or in a narrower band of, e.g, ±10%, ±5%, or ±1% around a selected center frequency. Exemplary microwave sources include the MG5349M tunable S-band magnetron [E2V Technologies Ltd., Chelmsford, England] having a frequency range of 2992 to 3001 MHz; the model K3C C-band compact klystron high power amplifier [CPI Satcom Division, Palo Alto, Calif.] having a frequency range of 5.850 to 6.425 GHz and instantaneous bandwidth of as much as 80 MHz; and the S5CI rack-mount SSPA [CPI Satcom Division, Palo Alto, Calif.] having a frequency range of 5.850 to 6.425 (optionally to 6.725) GHz. Frequency may be swept in a fairly continuous fashion through the operative bandwidth, swept in a series of discrete steps within the bandwidth, or hopped systematically or randomly from one frequency to another within the operative bandwidth depending on the needs of a particular process. Power may be held relatively constant or it may be varied during the process, either following a preset recipe or profile, or under active feedback control involving a process monitor.

Example

A system was designed to operate on C band, using a 2.0-8.0 GHz, 500 W S/C band rack-mount TWTA [Model VZS/C-2780C2; Communications and Power Industries Canada, Inc., Georgetown, Ontario]. High power output was delivered to the microwave launcher through a standard WR137 ridged waveguide.

Those skilled in the art will realize that the aforementioned power supply has a very wide frequency range (2 octaves), and it will therefore be appreciated that other waveguides (e.g., WR430, WR340, WR284, WR187, etc.) may be suitable for particular frequency ranges.

Example

Figure 1A:
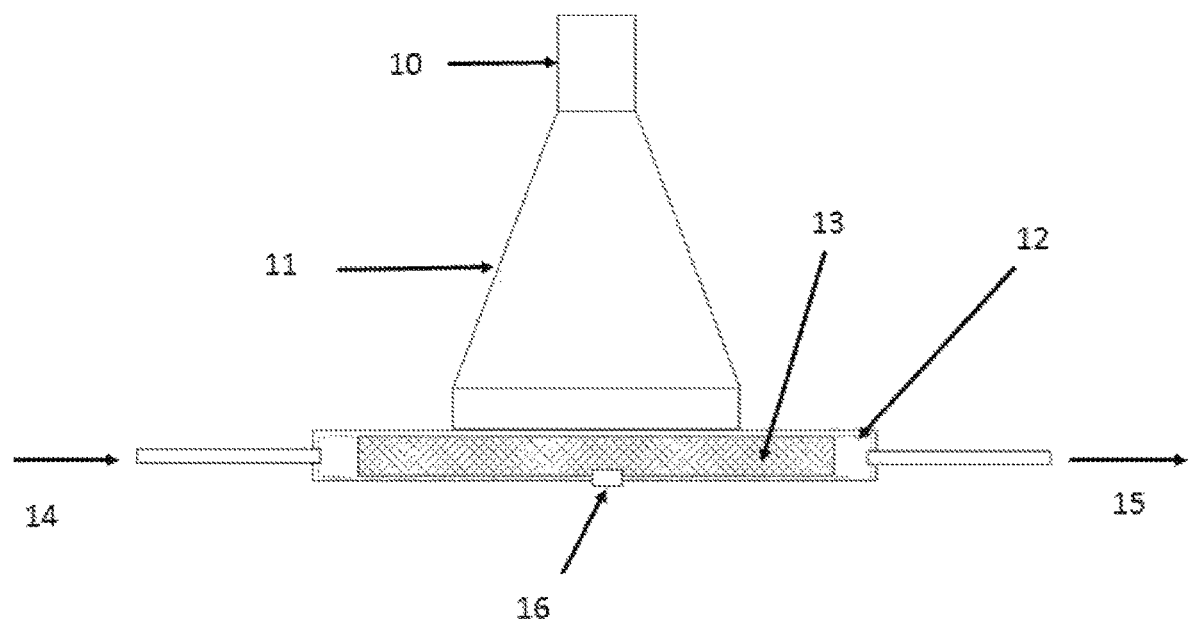
FIGS. 1A-B present a schematic diagram of one example of the present invention, configured to evaluate and perform catalytic processes involving a gas phase and a solid catalyst.
Figure 1B:
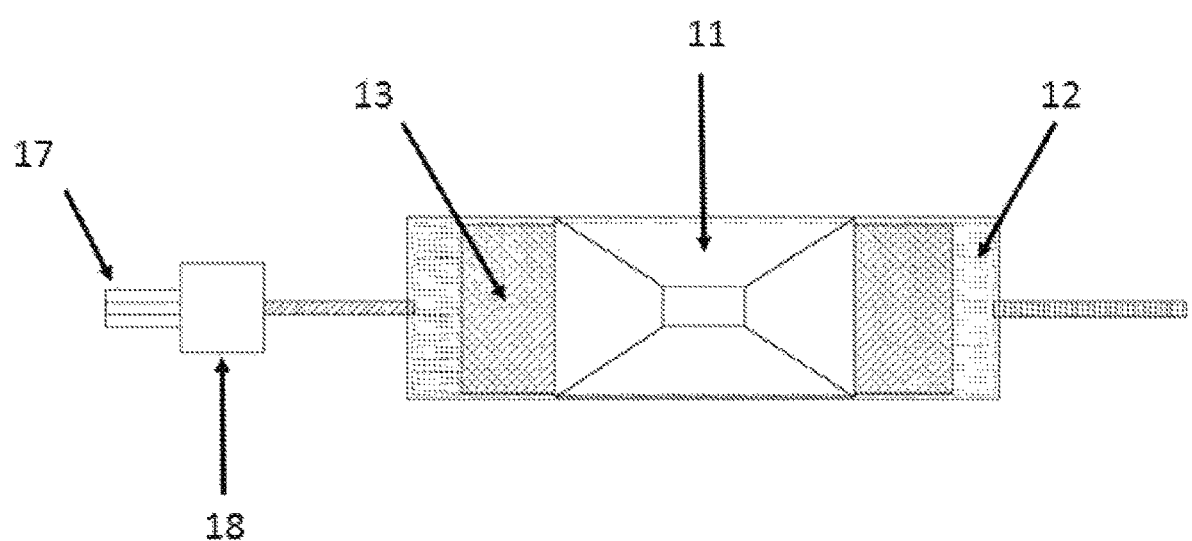

As shown schematically in FIG. 1, a horn antenna 11 [Model 137-441-2; L3 Narda-ATM, Patchogue, New York], was connected to the WR137 waveguide 10. This horn has an output face 3.42×2.50 inches, and is 6.51 inches long. A microwave-transparent chamber 12 for holding catalyst material 13 is about 2.50×6 inches, so that it is as wide as the narrow dimension of the horn, and extends beyond the edges of the horn in the long direction. Gas inlet 14 and outlet 15 ports are configured to allow selected gases to pass through the catalyst in the long dimension (from right to left as viewed in FIG. 1). The chamber 12 is preferably longer than the catalyst 13 so that gases may expand before entering the active catalytic region. The thickness of the chamber in the direction normal to the output face of the horn is preferably less than about 1 inch, and more preferably about 0.5-1.0 inch. This thickness is significantly less than one wavelength over the relevant microwave frequency band (2.02-1.44 inches depending on the instant frequency).

Optional features include window 16 for measuring temperature using an optical pyrometer, mass flow controller 17 for controlling the flow of one or more gases, and heater 18 to heat incoming reactant gases to a desired temperature.

Figure 2:
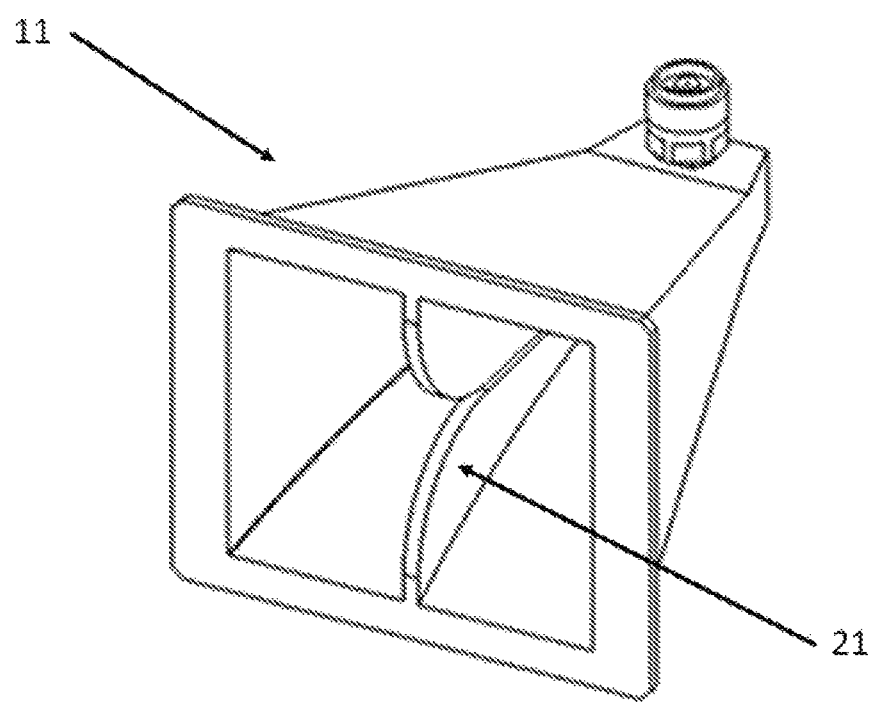
FIG. 2 illustrates one example of a wideband horn antenna compatible with a ridged waveguide.

As shown in FIG. 2, horn 11 preferably has internal ridges 21 analogous to and compatible with a ridged waveguide.

Figure 3:
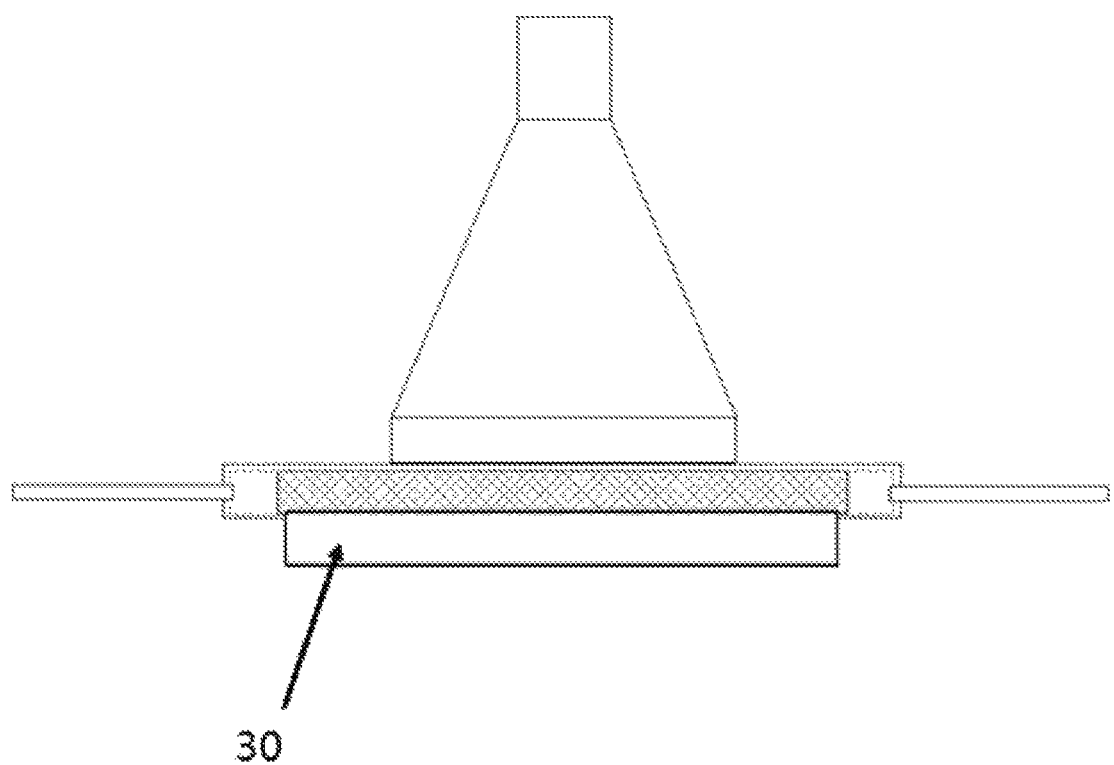
FIG. 3 is a schematic diagram of another example of the present invention, configured to evaluate and perform catalytic processes involving a gas phase and a solid catalyst. In this configuration, a supplemental heating element is provided below the catalyst.

An auxiliary temperature-controlled heater [30 in FIG. 3] may be used to preheat the entire sample to a selected temperature or to provide supplemental heating in addition to the heat generated by microwave absorption.

Applicants have discovered, surprisingly, that the inventive near-field applicator works very well, while clearly violating the guideline taught by Ekemar '402 to be necessary for constructing a near-field applicator. Specifically, in the example above, the volume of the horn and catalyst chamber is about 41 $in^3$, and the volume of the catalyst chamber alone is about 15 $in^3$; these volumes are significantly greater than the cube of the maximum wavelength (~8 $in^3$). Thus, in the present invention, near-field behavior is achieved by limiting the thickness of the catalyst be to less than one wavelength, while exploiting an outwardly-tapering horn to expand the useful area to lateral dimensions significantly greater than one wavelength.

It will be appreciated that other horn geometries might be useful for other heating applications, as described in the following example.

Example

Another horn antenna [Model 137-444E-2; L3 Narda-ATM, Patchogue, New York] has an output face with dimensions of 5.79×1.37 inches, and is 15.20 inches long. The elongated form factor may be desirable for applications involving curing polymer adhesives in composite lap joints, applying weather stripping, etc., where there is no need to heat the rest of the workpiece other than the adhesive bond line.

Example

The system illustrated schematically in FIG. 1 is particularly suitable for performing various microwave-assisted chemical reactions. This might be done in a continuous mode with a fixed catalyst and a fixed gas mixture, e.g., for processing a toxic off-gas stream, manufacturing synthesis gas or other products. Alternatively, the catalyst may be fixed and the inlet gas composition may be varied while analyzing the outlet gas composition. In this mode, the system can be used as a research tool to evaluate the interrelated effects of catalyst, microwave parameters, and composition to better understand or develop improved catalysts for use with a microwave heated reactor.

Example

In a more sophisticated research configuration, the fixture could be divided into an array of individual cells containing discrete catalyst samples and individual gas inlets and outlets, so that a large number of catalysts could be evaluated in parallel while holding gas composition and microwave parameters constant.

Example

In another research configuration, the fixture might contain a monolithic catalyst support, upon which different catalysts are arranged in different areas. A thermal imaging device may be positioned to observe the surface temperature distribution during heating and gas exposure, in order to look for differences that would be indicative of the relative performance of the various catalytic areas. This mode would allow the researcher to rapidly screen large numbers of catalyst modifications and find those with attractive properties.

It will be appreciated that the invention may be used with virtually any suitable combination of gases and any type of solid catalyst including, but not limited to, supported catalysts, monolithic catalysts, platinum group metal catalysts, metal oxides, zeolites, and others. Gas reactions may include, but are not limited to: synthesis reactions, water-gas reactions, cracking, hydrogenation, oxidation, decomposition, and others. It will be appreciated that the gas pressure in chamber 12 may be controlled to a level that will support the formation of a plasma.

Thermal plasma can be characterized by a thermodynamic equilibrium, with all species (electrons, ions, and neutral species) having the same temperature (energy). An example for thermal plasma is arc plasma and its temperature may be around 10,000 K. Non-thermal plasmas are characterized by a non-equilibrium between the temperature of the electrons and the ions. The temperature of the electrons ranges between several electron volt (eV), whereas the temperature of the positively charged ions and neutral species is significantly colder (about room temperature) leading to a very low overall temperature. Therefore, non-thermal plasmas, also called non-equilibrium plasmas, are favorable for the synthesis of materials (e.g., nanoparticles) at low temperatures.

Combining the two processes leads to plasma catalysis, which is an emerging technology that holds promise for improving existing technologies for numerous applications which include but are not limited to: air purification, hydrocarbon reforming, synthesis of nanomaterials, hydrogen production and ammonia production. The advantages of plasma catalysis over traditional catalysis are enabled by combining the high reactivity of the plasma with the high selectivity of the catalyst. The aim of plasma catalysis can be described as generating reactive species in the plasma and allowing them to react at the catalyst surface, forming the desired products with high conversion efficiencies and very high selectivity and at a low energy cost.

When catalysts are combined with plasmas, they are usually incorporated into non-thermal plasma. The catalyst is placed either inside the plasma (in-plasma catalysis) or after the discharge zone (post-plasma catalysis). Some studies show that the catalyst can be more effective at increasing gas conversion efficiencies when placed inside the plasma. In either case, the plasma can be used to supply energy for catalyst activation and it can also provide the reactive gas species needed for reactions on the catalyst surface.

For in-plasma catalysis, the catalyst is in contact with the discharge and, therefore, is also in contact with the short-lived excited species, radicals, photons, and electrons. In the post plasma catalysis, the catalyst is only exposed to the long-lived species that exit the discharge. The catalyst material can be typically introduced in the form of pellets, honeycomb monoliths or foams.

Depending on the interest with short-lived or long-lived species, the inventive applicator can allow both in-plasma catalysis with a single system, and post-plasma catalysis with two identical systems having independent controls.

The inventive near-field applicator also has applications in joining and repair operations in which a polymer is to be cured quickly. Examples include adhesive bonding (metal-to-metal, metal-to-polymer, or polymer-to-polymer), repair of polymer-matrix composites (fiberglass or carbon fiber reinforced); spot-curing of thermosetting patches and fillers; localized heating of thermoplastics for bonding or other purposes; and localized curing to tack an assembly together before moving it to a larger oven to do the final curing.

Example

Figure 4A:
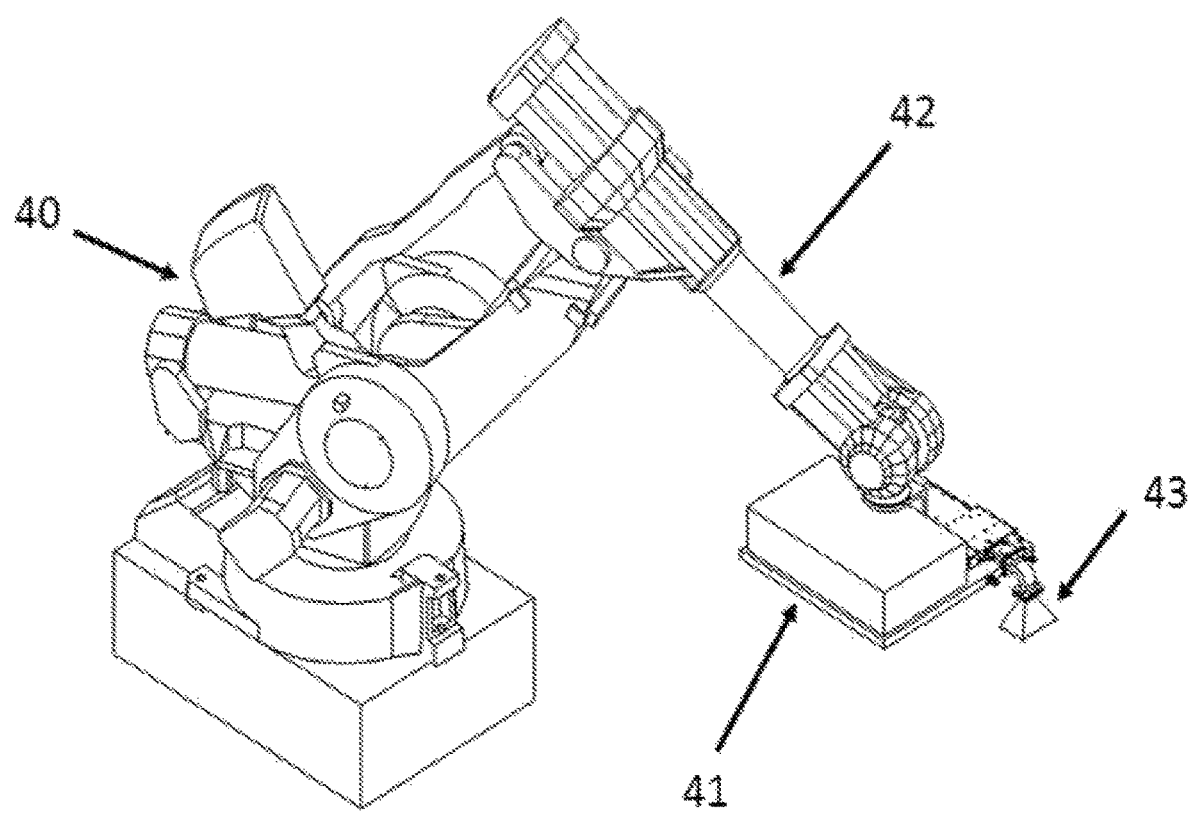
FIGS. 4A-C illustrate another example of the present invention, configured to position a wideband horn applicator for bonding and repair applications.
Figure 4B:
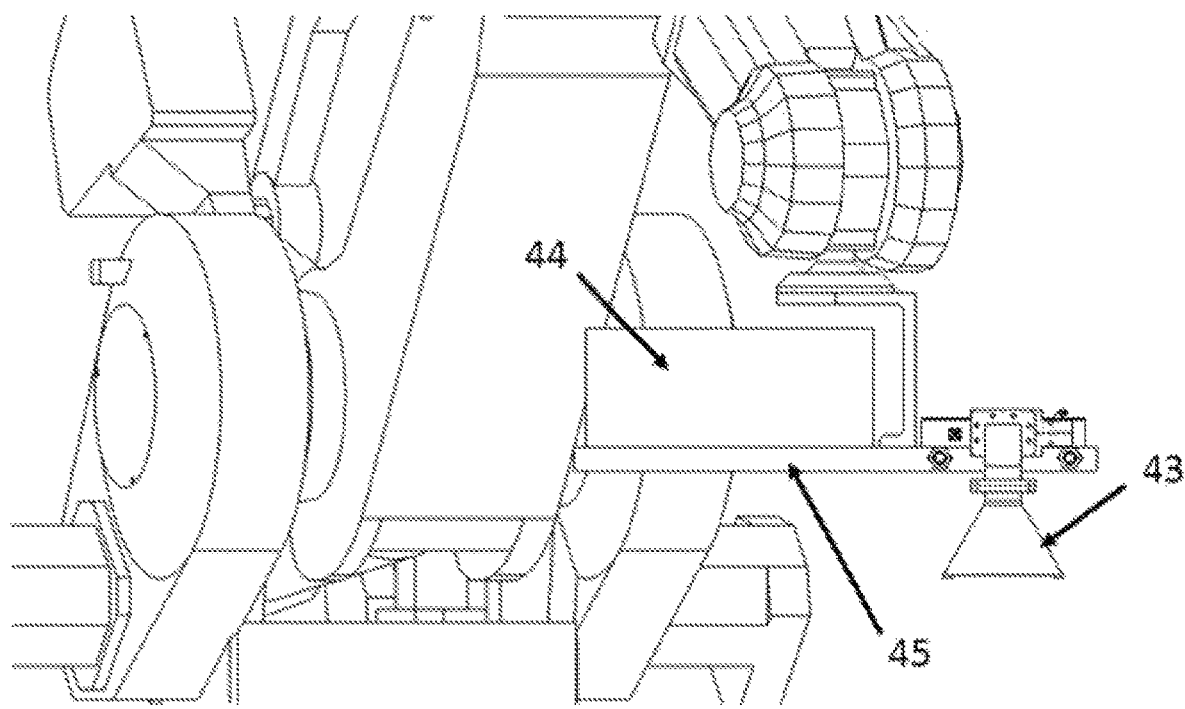
Figure 4C:
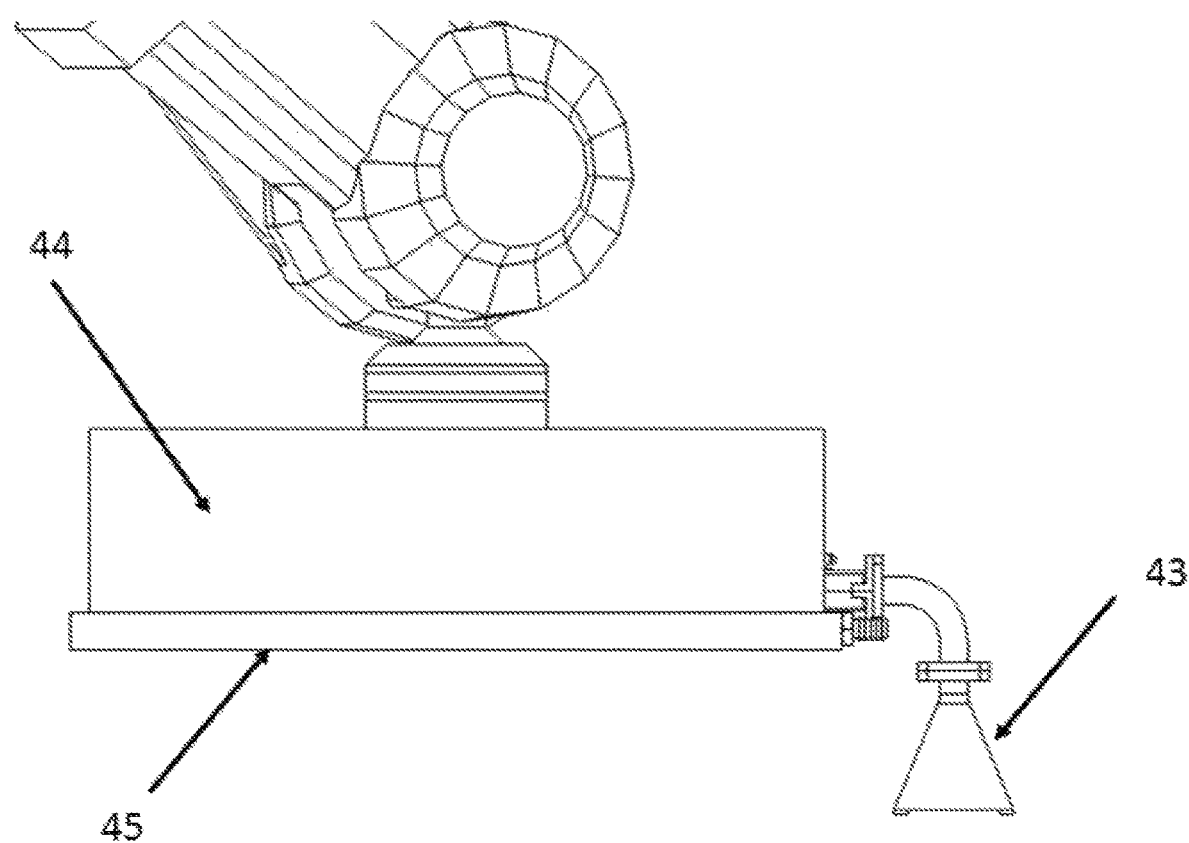

Automobile assembly typically involves a high degree of automation, with large robots capable of holding robust tooling to perform welds or other operations on chassis and body components held in customized fixtures. FIG. 4A shows a conventional factory robot 40 [Model IRB 7600, ABB Robotics, Affolternstrasse 44, Zurich, Switzerland] with a microwave system 41, as generally described above, mounted on the arm 42 so that the horn may be brought into contact with a workpiece (not shown). FIGS. 4B-4C show the microwave device in more detail. Here, the power supply 44 and horn assembly 43 are all arranged on a common platform 45, which then hangs rigidly from the end of the arm.

Example

The system shown in the preceding example might be used, for example, to join a weather strip assembly to a metal door frame using a thermoset adhesive. The horn applicator would be brought down to apply pressure and microwave energy to a small area of the weather strip assembly to locally spot-cure the adhesive or "tack" the strip into place; the process would be repeated at enough other places to secure the assembly in its desired pattern. Then, the entire assembly could be moved into a larger oven (which may accommodate racks with many such assemblies) for a longer cure to complete the adhesive bond around the entire periphery of the door frame.

In this context, it will be clear that when Applicants refer to "material to be cured" or "material to be treated", this means material to be cured in that particular heating cycle. In other words, an extensive bond line might be treated, as described above, in a series of discrete spots. The material to be cured in one particular cycle will therefore be that portion of the material that is under the applicator at the time, and all of that material will lie within one wavelength of the applicator (measured in the direction of microwave propagation).

Example

Figure 5:
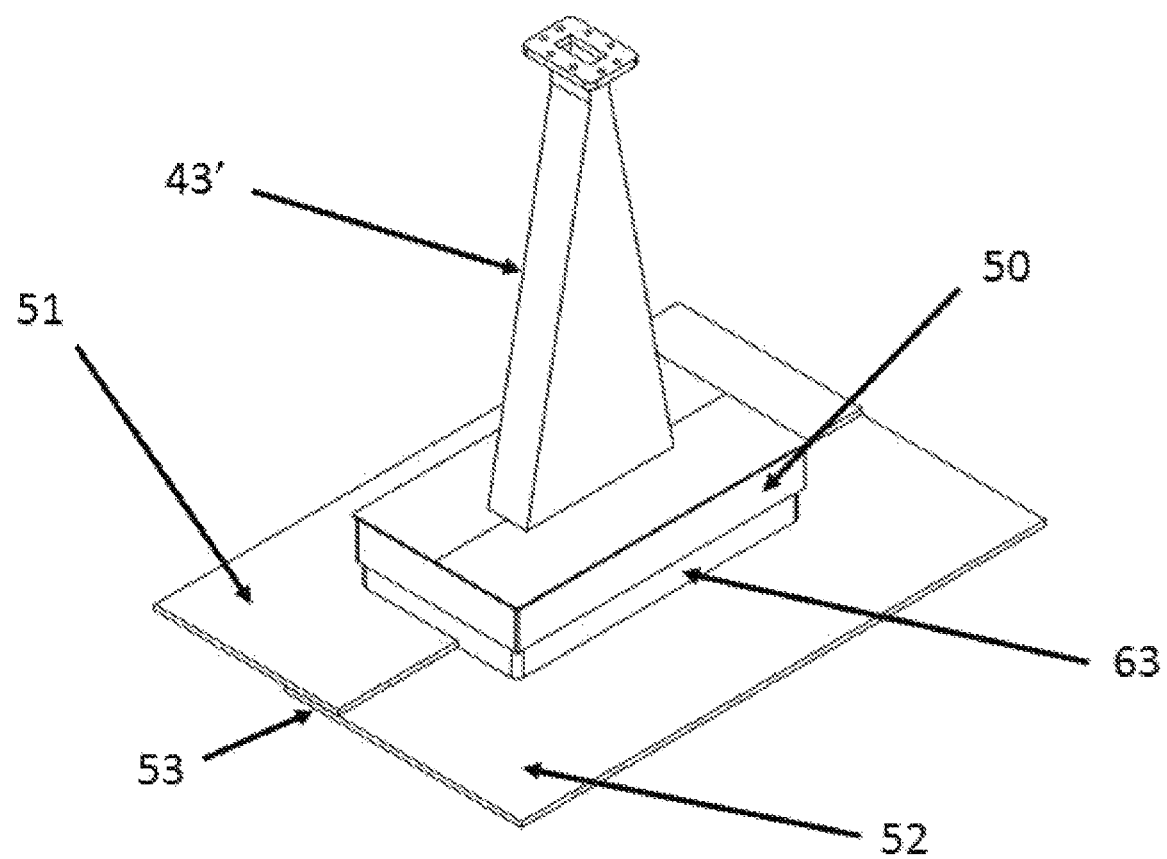
FIG. 5 illustrates another example of the invention, configured to apply microwave energy to a seam to be bonded.

In another example, the horn 43' might be configured to be significantly elongated in one direction relative to the orthogonal direction, as shown generally in FIG. 5. This configuration could be used when a long lap joint or seam is to be cured in situ without a later oven cure.

Example

In order to reduce or eliminate microwave leakage, a microwave choke 50 may be provided to sealably engage the workpiece surfaces 51, 52 and allow the horn to conform to the step associated with the lap joint 53, as shown in FIG. 5. The microwave choke may contain one or more microwave-attenuating structures 63, including: conductive sheet metal strips such as copper or beryllium copper alloys; woven stainless steel or compressible Monel gaskets, compliant silicone rubber filled with conductive particles, or lossy foam materials such as the MF2 product series [Mast Technologies, San Diego, Calif.], etc., as are well known in the art.

When lossy foam materials are be used, a flange 61 may be provided that surrounds the horn 43" or waveguide 62 opening and extends outward for a selected distance so that lossy foam or other microwave attenuating element 63" may be affixed to the flange as shown generally in FIG. 7. The width of flange 61 will therefore control the effective distance that microwaves will have to travel laterally within the lossy material before escaping, so that a wider flange will provide greater attenuation as well as a more extensive surface upon which to secure the lossy material 63".

Example

Figure 6:
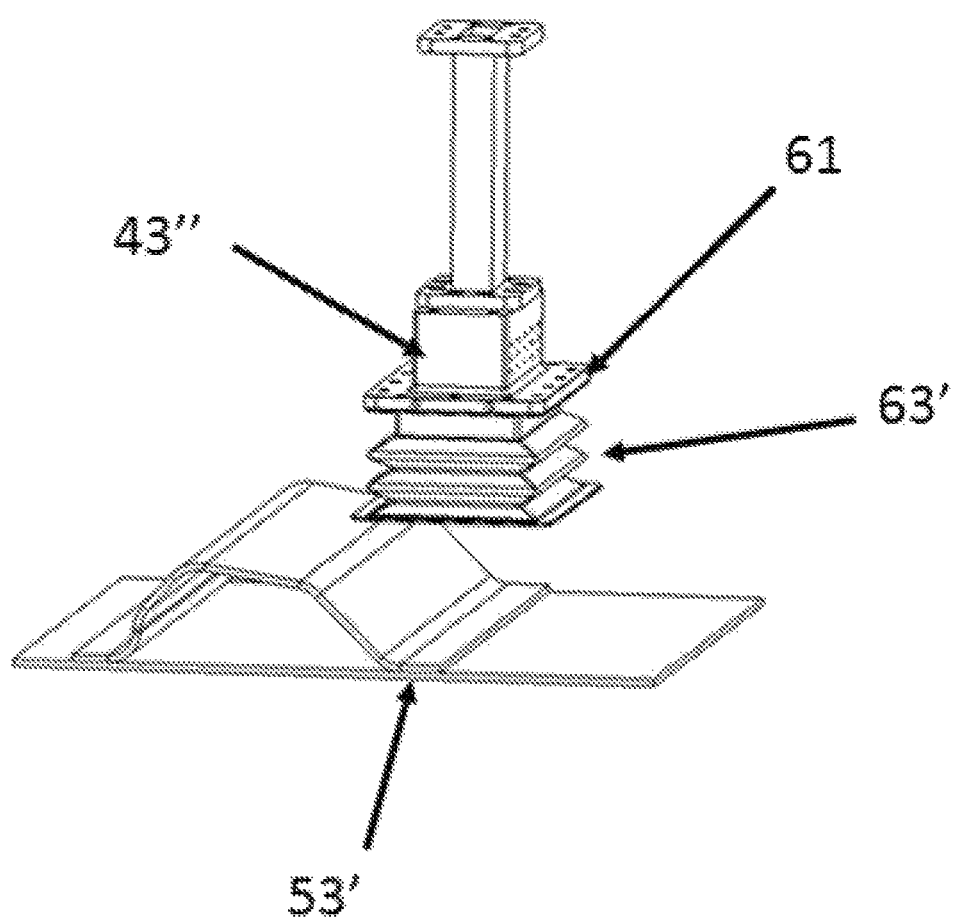
FIG. 6 illustrates another example of the invention, having a flexible choke configured to apply energy to a lap seam while conforming to a workpiece having a larger vertical offset.

FIG. 6 is a schematic illustration of a fabricated applicator as a variant of the horn shown in FIG. 5. In this case, a flange 61 surrounds the waveguide opening (applicator) 43" and extends outward for a selected distance where a large flexible boot 63' comprises a bellows-like arrangement for the most compressibility that allows conformal contact to a large vertical mismatch at lap joint 53' such as that shown in FIG. 6. A flexible boot was cast out of conventional two-part RTV silicone and a conductive coating [Flexible, High Temperature, Electrically Conductive Coating 124-47 by Creative Materials, 12 Willow Road, Ayer, Mass. 01432] was sprayed both on the inside and outside of the boot and cured for 2 hours at 150° C. The flexibility of the silicone boot made good contact at the lap joint offset, so it could seal well for microwave leakage. However, the sprayed conductive coating which had fairly good conductivity (low resistance ~10 ohms) right after cure did not bond well to the silicone substrate and started to peel and flake off during the compressive movement of the bellows-like boot.

To overcome the bonding issue one approach would be to fabricate the boot from a continuously co-extruded highly conductive metal filled silicone outer layer on a high-strength silicone rubber core [Dual Elastomer ULTRA-VANSHIELD, U.S. Pat. No. 4,968,854 by Vanguard Products Corporation, 87 Newtown Road, Danbury, Conn. 06810 USA].

Example

Figure 7A:
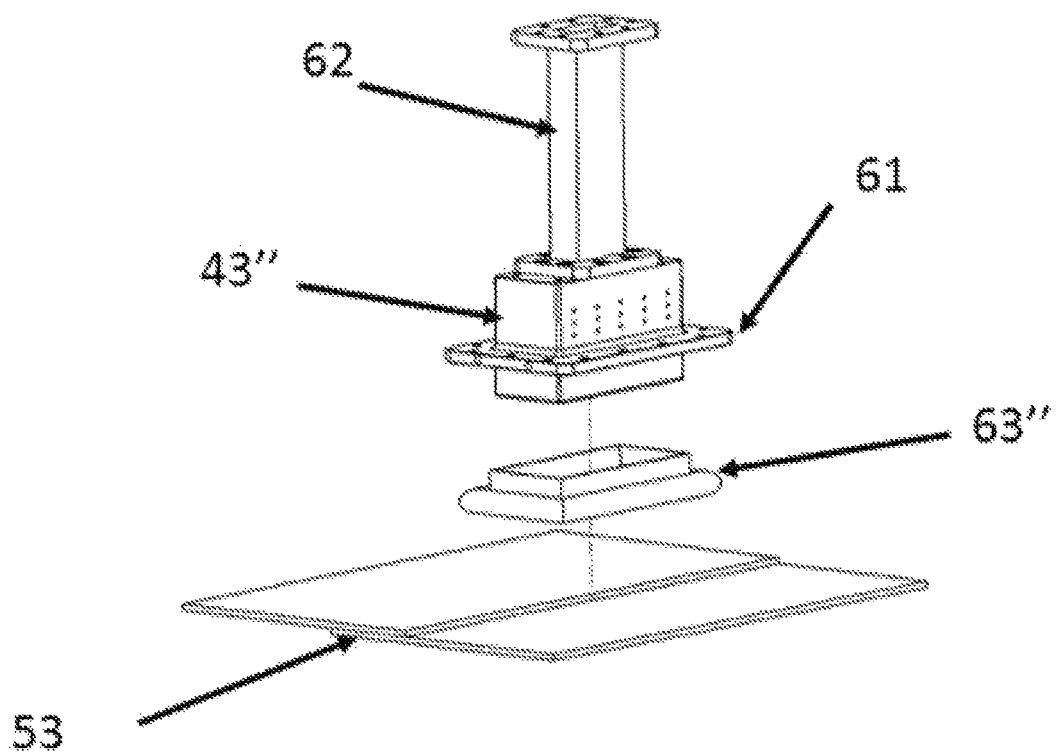
FIGS. 7A-B illustrate an example of a near-field applicator having an integral microwave choke and gasket arrangement.
Figure 7B:
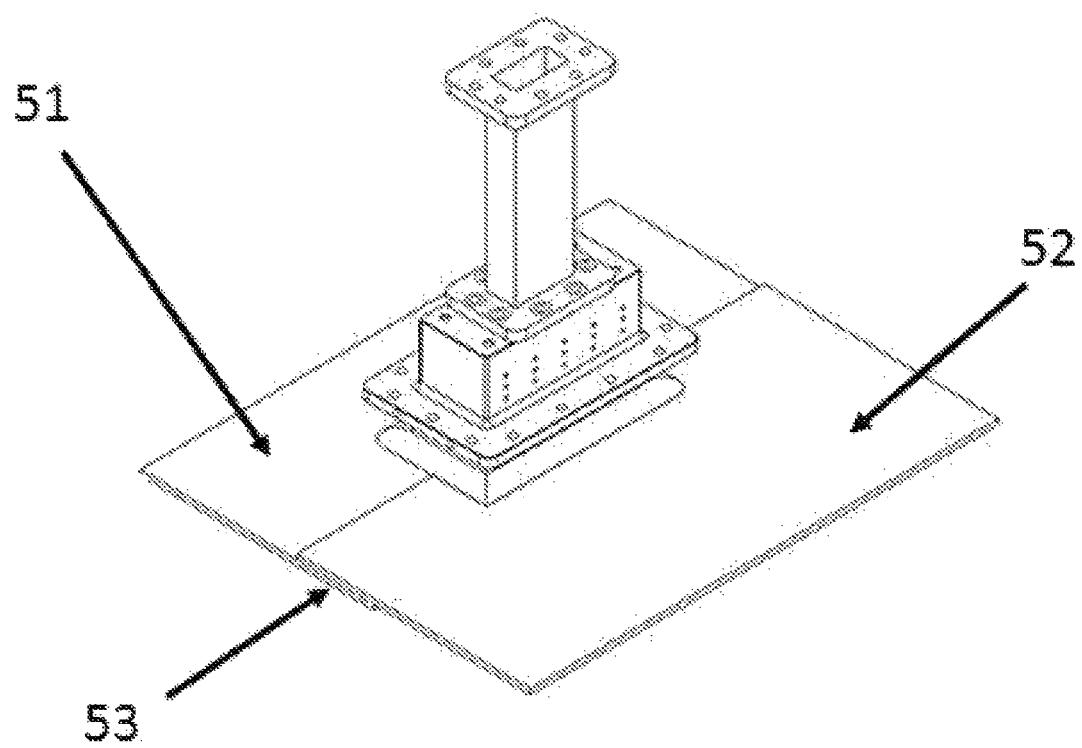

FIG. 7A is a schematic of a fabricated applicator where a flange 61 surrounds the waveguide opening (applicator) 43" and extends outward for a selected distance where the 12 mm compliant ULTRA-VANSHIELD® P gasket 63" (shaped into a rectangle shown between the applicator and composite in FIG. 7A) is affixed to the flange. As shown in FIG. 7B, when the waveguide/applicator/gasket assembly is compressed against the workpiece 51, 52 the elastomer, with its optimum combination of metallic conductivity and elastomeric properties, makes a conformal contact between the workpiece and applicator flange, thereby sealing the microwave leakage. When either fixed frequency or variable frequency microwave (VFM) power (180 W) was delivered into applicator 43", the microwave leakage was found to be 0.15 mW/cm$^2$ on the top or applicator side of the workpiece. On the bottom side of the workpiece the microwave leakage was not even detectable. A fiber optic probe was attached to a composite coupon to determine the temperature. With VFM the fiber optic recorded a temperature of 172° C., whereas with fixed frequency at 5.85 GHz the temperature was only 78° C. at the fiber optic probe. However, during this fixed frequency run another area heated much more than the area where the fiber optic probe was attached. The temperature difference was easily sensed by touching the bottom side of the workpiece. On cooling and examining the composite corner had heated significantly to decompose the polymeric resin and delaminating the carbon fiber layers. These hot and cold spots commonly observed with fixed frequency in larger multimode ovens are also probable in smaller near field heating applications. For this reason, Applicants prefer to employ some degree of frequency sweeping (at least ±1%) despite the fact that the applicator doesn't employ a resonant cavity.

Figure 8A:
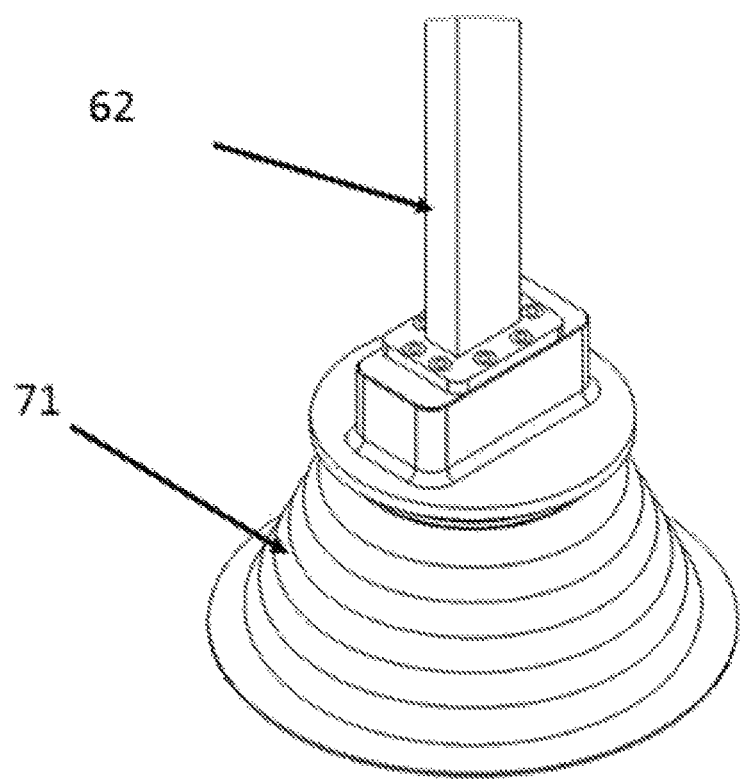
FIGS. 8A-B illustrate another example of a near-field applicator having an integral microwave choke comprising a boot/gasket combination arrangement.
Figure 8B:
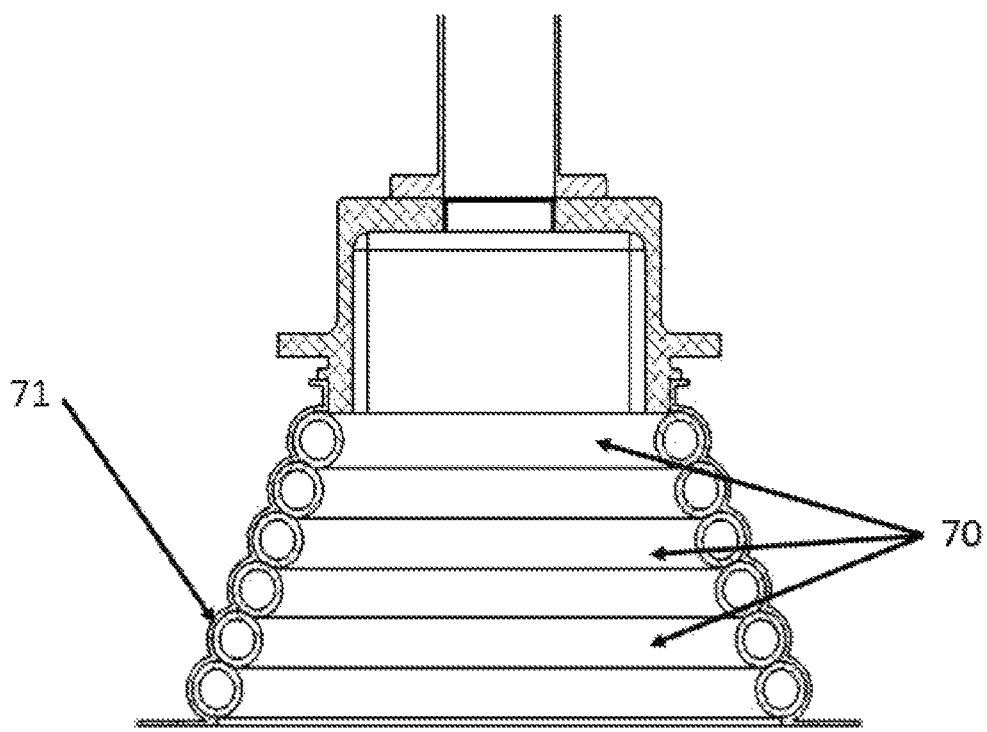

Because of the high shielding effectiveness, low compression force, resistance to permanent compression set, as well as the ability to create at least a partial environmental seal, a smaller diameter gasket was tested as a microwave cavity door seal. The door was cycled 100,000 times and there are no significant signs of wear on the outer conductive layer and hence no degradation in the microwave sealing capability. In view of these properties Applicants contemplate that one could fabricate an absorber with such a material or a combination of multiple ULTRA-VANSHIELD (O-ring) gaskets in an absorbing silicone boot. FIG. 8A shows the isometric view and FIG. 8B the cross-sectional view of a stack of gaskets 70 of varying diameters providing the electrical contact whereas the outer boot 71 houses and holds the gaskets in place. The flexibility of the boot and compressibility of gaskets will allow sealing of joints with larger lap offset in a manner analogous to the single ring demonstrated in the foregoing example.

Although conventional microwave devices may use various microwave chokes around door openings or around incoming and outgoing conveyors, for example, such chokes are generally not intended to be brought into direct contact with the material being heated. Applicants therefore contemplate a unique choke design that meets several requirements: First, it is sufficiently compliant to engage a surface that may be curved and/or may contain a lap joint or other feature that requires sufficient compliance to conform to a surface that is not perfectly planar. Second, the choke will to some degree be subjected to heat, either conducted from the workpiece, which is being actively heated, or generated within the choke materials by the microwave leakage being attenuated.

Example

One way to meet these two requirements is to provide a water-filled tube or bladder structure surrounding the periphery of the waveguide. The bladder would be inflated with water and act like a balloon that will deform when compressed and thereby conform to a wide variety of surfaces. The water is an excellent microwave absorber and will thereby enhance the microwave attenuation. Furthermore, the water may be recirculated to prevent heat buildup in the choke and applicator assembly.

Example

In some applications, the bonded area may be of fairly limited size, or it may comprise a seam that is narrow and also curved, e.g., around the door frame of a car. In such applications, a wide or elongated horn may be impractical. For spot curing, therefore, the horn may be eliminated and the inventive microwave choke may simply be disposed around the open end of the waveguide itself. Again, this has the electrical effect of a waveguide terminating in a dummy load. It will be appreciated that the waveguide in this case might or might not be a ridged waveguide, and if it is a ridged waveguide, the internal ridges might be tapered for some distance leading up to the end in order to enhance the power uniformity over the entire area of the waveguide where it engages the workpiece.

Example

The inventive device may be used as follows:
1. Articles to be joined are held in a fixture with an adhesive layer in the joint space;
2. The robot arm positions the horn over the area of the joint to be cured;
3. The horn is pressed downward to apply pressure to the adhesive bond and to the compliant microwave choke;
4. Microwave power is applied for a sufficient time to create an adhesive bond of adequate strength; and,
5. If desired, the microwave horn is moved to another place on the workpiece and the process is repeated.

Example

The inventive device may be used for field repair or patching, e.g., when an area on the surface of a polymer composite aircraft structure or boat hull has been damaged. In this case, the method might include the steps of:
1. Clean the damaged area and remove any cracked or defective material;
2. Apply a curable polymer patch, prepreg laminate, or a mixture of polymer and fiber cloth;
3. Optionally provide a separation layer or protective film to prevent adhesion between the horn and the patch material;

4. Press the horn against the patch to provide pressure to the adhesive joint and engage the microwave choke;
5. Apply microwave power to cure the patch material.

Example

For spot repairs, particularly when each job is likely to be different and the use of robots and/or standardized tooling is impractical, it might be desirable to separate the horn from the power supply so that the generally heavy power supply is stationary or contained in a rolling cart or dolly. The horn, in this case, would then be configured to accept a coaxial input cable, which would allow a very flexible connection (in contrast to the rigid waveguide shown in other examples). Then, the operator would hold the horn and place it manually against the surface being repaired; a safety interlock will preferably be arranged on the output face of the horn so that microwave power will not be activated unless the microwave choke is securely seated onto the workpiece.

The invention may be further modified for even greater versatility by providing various horn applicators optimized for different repair jobs. For example, the output face of one horn may be flat, whereas others may be shaped to conform to various radii as might be encountered on the surfaces of aircraft or pleasure boats. Different sizes of horns and different operating frequencies might be better suited to different workpieces, e.g., one size and frequency range for repairing fiberglass composites and a different size and frequency range for repairing carbon fiber composites. Each launcher might have the same type of coaxial input so they can be easily exchanged on a common power supply. Alternatively, several applicators may be permanently connected to the power supply, with a microwave switch configured to select a particular applicator for a given job.

Example

A straight waveguide was connected to the power supply described above and extended into the chamber of a Micro-Cure 5100 microwave processing system [Lambda Technologies, Morrisville, N.C.]. The waveguide terminated 0.25 in. above the sample, which consisted of a lap joint formed between an aluminum plate and a carbon fiber composite. The aluminum was on the bottom, and a small coupon of aluminum was placed under the far end of the carbon fiber composite to support it in a horizontal position parallel to the aluminum plate. The sample was manually compressed to distribute the thermoset adhesive across the joint surface, but no pressure was applied during processing. Thermal paper was placed under the assembly and several fiber optic temperature probes were placed proximate to the lap joint.

Microwave power was swept over the frequency range 5.85-6.65 GHz; 400 W was applied for 35 seconds. Temperature directly under the waveguide reached 250° C.; the temperature about 2 inches away, under the aluminum plate, was about 93° C. Darkening of the thermal paper showed that the area of the lap joint was efficiently and uniformly heated. Upon cooling, the sample showed good adhesion.

Example

A similar lap joint assembly was treated using a horn antenna placed 1 inch above the lap joint and oriented with the long axis of the horn parallel to the long axis of the specimen, so that it covered the bond area along with a portion of the substrates on either side of the lap joint.

Microwave power was again swept over the range 5.85-6.65 GHz; 400 W was applied for 50 seconds. The maximum temperature directly at the lap joint was 220° C.; the temperatures on either side were about 100° C. under the aluminum and 86° C. under the composite. The thermal paper again indicated thorough and uniform heating of the lap joint. The adhesive bond was good and showed no visible burns.

In some of the examples described above, it was contemplated that the microwave choke would be a somewhat compressible structure, which would serve the dual purpose of sealably engaging the workpiece and also applying mechanical compression to a composite or adhesive joint during cure. For situations in which mechanical compression is not needed, Applicants have discovered a surprisingly effective and inexpensive shielding strategy as described in the following example.

Example

Using the setup previously described, with a straight waveguide terminating just above the workpiece, a skirt of conductive fabric was clamped around the waveguide so that it draped over the workpiece. With the microwave power on, there was no microwave leakage detected in an opening about 6 inches away from the waveguide in the rear of the VFM chamber. Suitable conductive fabrics include Ni—Sn plated conductive polyester [MEA series, E-Song America, Campbell, Calif.].

For applications where higher temperatures might degrade conductive cloth, a flexible elastomeric sheet may be used. One example of such a product is the Surface Wave Absorber product series, e.g., MR31-0004-20 [MAST Technologies, San Diego, Calif.].

As discussed earlier, in a conventional multimode VFM system, uniformity is achieved by establishing many, rapidly changing, mode patterns within the cavity. It follows from this that conventional VFM systems are configured to avoid placing the workpiece in or near the microwave launcher, to avoid near-field effects. However, there may be situations in which a user might wish to do controlled near-field experiments from time to time in an otherwise general-purpose VFM oven such as the Vari-Wave II [Lambda Technologies, Morrisville, N.C.]. It is therefore desirable to have a separate tool or accessory that can be removably mated to the existing system to run such tests.

Example

A conventional multimode VFM system may be modified as follows so that near-field experiments can be carried out conveniently. A horn structure as shown generally in FIGS. 1 and 3 may be constructed of a size that can be installed within the VFM cavity. The inlet waveguide (shown at the top in FIGS. 1 and 3) would be of a size and shape to slide into or otherwise engage the existing microwave launcher in the VFM cavity and thereby convey the microwave power and spread it over a larger area while maintaining near-field propagation characteristics.

Example

To demonstrate the ability to perform near-field heating in a general-purpose VFM cavity 80, in which the existing launcher is on the rear wall of the chamber, two standard waveguide H bends 82 were attached to direct power to a waveguide launch in the middle of the chamber as shown generally in FIG. 8A. A fixture 83 was constructed to support a quartz tube 84 through which process gases could be passed as shown generally in FIG. 8B.

We claim:

1. A method for heating materials by microwaves comprising the steps of:
   a) providing a variable-frequency microwave source characterized by a center frequency and a usable bandwidth about said center frequency, and further comprising an open launch structure having selected lateral dimensions;
   b) bringing said open launch structure into close proximity to a material to be heated so that the entire thickness of said material to be heated lies within one wavelength of said open launch structure; and,
   c) applying microwave power over a selected frequency range such that the microwave energy heats said material to a selected temperature.

2. The method of claim 1 wherein said material to be heated comprises a solid catalyst and a reactive gas phase contained within a microwave-transparent chamber disposed proximate to said open launch structure.

3. The method of claim 1 wherein said material to be heated comprises at least one polymer component to be cured.

4. The method of claim 3 wherein said material to be treated is selected from the group consisting of: metal-to-metal, metal-to-polymer, and polymer-to-polymer adhesive bonds; fiberglass- and carbon-reinforced polymer-matrix composites; thermosetting resins; and thermoplastics.

5. The method of claim 1 further comprising the step of:
   d) placing a compliant, microwave-attenuating material around the periphery of said open launch structure to sealably engage the surface of said material to be heated and reduce microwave leakage thereby.

6. The method of claim 5 wherein said compliant microwave-attenuating structure comprises at least one component selected from the group consisting of: conductive sheet metal strips; woven stainless steel gaskets; compressible Monel gaskets; filled silicone rubber; lossy polymeric foam; conductive fabric; water-filled polymer tubes and bladders; flexible filled elastomeric sheets; and flexible filled elastomeric boots.

7. The method of claim 1 wherein said microwave source is mounted on a robotic arm so that said launch structure may be brought into contact with said material to be heated.

8. The method of claim 3 wherein:
   said material to be heated comprises a thermosetting resin; and,
   step (c) is repeated at a plurality of areas of said material, after which said material is placed into an oven for further heating.

9. The method of claim 1 wherein said open launch structure comprises a rectangular horn.

10. The method of claim 1 wherein said open launch structure comprises an open waveguide.

11. The method of claim 10 wherein said waveguide comprises a standard ridged waveguide selected from the group consisting of: WR137, WR187, WR284, WR340, and WR430 waveguides.

12. The method of claim 10 wherein said microwave source has an operable bandwidth in the range from 2.0 to 8.0 GHz and said open waveguide comprises a standard WR137 ridged waveguide.

\* \* \* \* \*